United States Patent
Burbach et al.

(10) Patent No.: US 6,905,924 B2
(45) Date of Patent: Jun. 14, 2005

(54) DIODE STRUCTURE FOR SOI CIRCUITS

(75) Inventors: Gert Burbach, Dresden (DE); Manfred Horstmann, Dürrersdorf-Diltersbach (DE); Thomas Feudel, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/629,436

(22) Filed: Jul. 29, 2003

(65) Prior Publication Data

US 2004/0188768 A1 Sep. 30, 2004

(30) Foreign Application Priority Data

Mar. 31, 2003  (DE) .......................................... 103 14 505

(51) Int. Cl.[7] .......................................... H01L 21/8234
(52) U.S. Cl. ..................................... 438/237; 438/311
(58) Field of Search ................................ 438/199, 208, 438/220, 237, 291, 301, 311, 328

(56) References Cited

U.S. PATENT DOCUMENTS

| 4,616,404 A | 10/1986 | Wang et al. ............... 29/576 B |
| 6,103,564 A | 8/2000 | Masuda ...................... 438/237 |
| 2002/0063288 A1 | 5/2002 | Maciejewski et al. ...... 257/350 |

FOREIGN PATENT DOCUMENTS

| EP | 0 923 132 | 6/1999 | ........... H01L/27/02 |
| WO | WO 02/061841 | 8/2002 | ........... H01L/29/00 |

Primary Examiner—Hoai Pham
(74) Attorney, Agent, or Firm—Williams, Morgan & Amerson, P.C.

(57) ABSTRACT

In an SOI diode structure, the conventional transistor-like MOS configuration is eliminated by replacing the polysilicon line by a completely dielectric region. This region may be used as an implantation mask to control a dopant gradient of a PN-junction that forms below the dielectric region. Moreover, during the salicide process, the dielectric region prevents the PN-junction from being shorted. Thus, a depletion of the active region caused by the MOS structure may be avoided. Therefore, the functioning of the PN-junction is maintained even for extremely thin semiconductor layers.

46 Claims, 4 Drawing Sheets

DIODE STRUCTURE FOR SOI CIRCUITS

BACKGROUND OF THE INVENTION

1. Field of the Invention

The present invention relates to the fabrication of integrated circuits, and, more particularly, to the formation of diodes in integrated circuits that may be used for ESD (electrostatic discharge) protection, temperature monitoring and the like.

2. Description of the Related Art

In modern integrated circuits, such as microprocessors, a huge number of circuit elements, especially transistors, are provided and operated on a restricted chip area. Although immense progress has been accomplished over the recent decades regarding the performance and the feature size of the circuit elements, the ongoing demand for enhanced functionality of electronic devices forces semiconductor manufacturers to steadily reduce the dimensions of the circuit elements and to increase the operating speed thereof. A promising design alternative for high-end integrated circuits having reduced parasitic capacitance and thus the potential for obtaining higher operating speeds represent so-called SOI (silicon on insulator) devices, which are fabricated within and on a thin crystalline silicon layer provided on an insulating substrate. Recently, SOI substrates having formed thereon a crystalline silicon layer of a comparable quality to that of bulk silicon substrates are now available at reasonable costs and render high-end circuits, such as microprocessors and the like, as attractive candidates for being fabricated on SOI substrates.

Although SOI devices offer a plurality of advantages due to the fact that the circuit elements may entirely be insulated from adjacent circuit elements, additional problems not encountered with devices fabricated on bulk silicon (bulk devices) may arise or other problems also addressed in bulk devices may even be exaggerated in SOI devices. For instance, the well region of a transistor device is typically isolated and the potential thereof floats, wherein, for example, minority charge carriers may accumulate and adversely influence the transistor characteristics, such as the threshold voltage. Thus, certain counter-measures, such as additional substrate contacts, band gap engineering, and the like, have to be taken so as to obtain the desired transistor performance. Moreover, the heat conductivity in SOI devices may usually be significantly lower than in bulk devices due to the low heat conductivity of the insulating layer that separates the semiconductor layer accommodating a circuit element and the substrate. Therefore, substantially all of the heat created in the semi-conductor layer has to be dissipated by the electric connections. The problem of heat dissipation becomes even more relevant in modem integrated circuits, which are typically operated at high clock frequencies and have an extremely high package density that continues to increase with every new circuit generation. Additionally, in SOI CMOS devices, the risk of damaging circuit elements by electrostatic discharge still exists in the same way as in bulk devices. Therefore, effective diode structures for discharging the excess charges are required, wherein the entire current and the heat associated therewith has to be conducted by the doped regions and the electric contacts connected thereto. Since relatively high currents may have to be discharged, a remarkable amount of additional heat may be created.

It is therefore very important to provide diode structures in SOI devices that exhibit characteristics approaching as closely as possible the characteristics of an ideal diode, thereby allowing effective monitoring of the die internal temperature and/or protection of the circuitry upon occurrence of ESD events.

With reference to FIG. 1, a conventional silicon diode structure as used in SOI devices will now be described in more detail to illustrate some of the problems associated therewith. In FIG. 1, a semiconductor structure 100 comprises a substrate 101, for example, a silicon substrate, having formed thereon an insulating layer 102 that is commonly referred to as a buried oxide layer, since, frequently, the insulating layer 102 is comprised of silicon dioxide. A semiconductor layer 103 is formed on the insulating layer 102 and comprises isolation trenches 104 that enclose an active region 105. The active region 105 may include dopants, such as P-type dopants in the form of boron. A highly doped P-type region 106 and a highly doped N-type region 107 are formed in the active region 105, wherein the highly doped N-type region 107, together with the P-doped active region 105, form a PN-junction 108. A thin insulating layer 109, which will be referred to as a gate insulation layer, is formed on the active region 105 and separates a conductive line 110, such as a polysilicon line, from the active region 105. The P-type region 106, the N-type region 107 and the polysilicon line 110 comprise silicide regions 111 including a silicide of any appropriate refractory metal, such as cobalt, nickel, titanium and the like. Moreover, sidewall spacers 112 are formed on sidewalls of the polysilicon line 110. In principle, the circuit element described so far may be considered as a typical transistor structure with the exception of the highly doped regions 106 and 107, which are doped inversely to each other, contrary to a regular N-channel MOS transistor that would comprise two highly doped N-type regions. Due to the similarity to an ordinary MOS transistor structure, the polysilicon line 110 will also be referred to as gate electrode 110.

The semiconductor structure 100 further comprises contact plugs 113 and 114 including, for example, tungsten and possibly any appropriate barrier layer (not shown), to provide enhanced diffusion barrier characteristics and adhesion to a surrounding insulating layer 115 that may, for example, be comprised of silicon dioxide. The contact plugs 113 and 114 may be connected to corresponding metal regions or metal lines 116 and 117, wherein the contact plug 114 is additionally connected to the gate electrode 110, for example in the form of a local interconnect (not shown). The metal lines 116, 117 are to represent one or more metallization layers required to provide the electrical connection to other circuit elements or to peripheral devices.

A typical process flow for manufacturing the semiconductor structure 100 may comprise the following processes. The substrate 101 including the insulating layer 102 and the semiconductor layer 103 may be formed by well-known wafer bonding techniques that provide the semiconductor layer 103 with a quality of the crystalline structure identical to that of bulk substrates. Thereafter, the isolation structures 104 may be formed by well-established photolithography, deposition and etch techniques. Thereafter, the gate insulation layer 109 and the gate electrode 110 may be formed in conformity with the typical process flow for the formation of transistor structures, which may simultaneously be provided at other areas of the substrate 101. The lateral dimension of the gate electrode 110 may be adjusted in accordance with design requirements in such a manner that an appropriate implantation mask is provided for subsequent implantation steps.

Prior to the formation of the gate electrode 110, one or more implantation steps may be carried out so as to provide a desired dopant profile in the active region 105. Thereafter, the gate electrode 110 is formed by patterning a polysilicon layer (not shown) using well-established photolithography and etch techniques. Next, a further implantation step may be performed to create, for example, the N-type region 107, wherein the part of the active region 105 intended to receive the region 106 is covered by a corresponding resist mask (not shown). Thereafter, the resist mask may be removed, a further resist mask may be formed over the N-type region 107, and a further implantation sequence may be performed to create the P-type region 106. During the implantation processes for forming the regions 106, 107, the corresponding resist masks may substantially avoid dopant penetration in the respective covered region, whereas it is, however, the gate electrode 110 that provides for the precise adjustment of the dopant profile of the regions 106, 107 below the gate insulation layer 109. Therefore, the gate electrode 110 substantially determines the characteristics, i.e., the dopant concentration, of the PN-junction 108. Typically, the implantation sequences are performed under conditions and with process parameters as required for the simultaneous formation of other transistor devices. Therefore, the implantation sequence may also include any sophisticated implantation techniques, such as tilted implantations and a halo implantation, as is usually necessary for high-end transistor structures. Although these implantation techniques may provide significant advantages for the transistor structures, the characteristic of the PN-junction 108, which substantially determines the diode behavior of the semiconductor structure 100, may remarkably deviate from the ideal diode characteristic. Moreover, any short channel effects as well as the floating body effect may necessitate additional complex dopant profiles within the active region 105, which may further adversely affect the electrical characteristics of the semiconductor structure 100.

Thereafter, the sidewall spacers 112 may be formed by depositing an insulating material and anistropically etching the dielectric material. Next, a refractory metal layer may be formed over the structure 100 and a heat treatment may be carried out so as to form the silicide regions 111 in the regions 106, 107 and the gate electrode 110. Thereafter, the dielectric layer 115 is formed by any appropriate deposition method and the contact plugs 113 and 114 are formed by etching respective vias into the dielectric layer 115 and filling the same with an appropriate barrier metal and a contact metal. During the formation of the contact plugs 113, 114, an electrical connection (not shown) to the gate electrode 110 is also formed to obtain a defined potential at the gate electrode 110 during the operation of the semiconductor structure 100. Finally, one or more metallization layers are formed, represented by the metal regions and lines 116, 117, so as to provide for the required electrical connections to other circuit elements and/or the periphery.

During operation of the semiconductor structure 100, which acts as a diode, the region 106, acting as an anode, and the region 107, acting as a cathode, of the diode structure are electrically connected in conformity with the circuit layout under consideration. For instance, a voltage supplied to the regions 106 and 107 may create a current through the PN-junction 108, wherein the current substantially depends exponentially on the applied voltage and temperature. Depending on the "ideality" of the PN-junction 108, the temperature may be monitored more or less accurately. As previously noted, tilted halo implantations as well as further advanced implantation schemes to control the floating body effect may have a significant influence on the diode characteristic. Moreover, the continual scaling of semiconductor devices also requires a corresponding reduction of the thickness of the semiconductor layer 103. The MOS structure, that is, the conductive gate electrode 110, the gate insulation layer 109 and the underlying active region 105, may cause a depletion region in the active region 105, which also influences the behavior of the PN-junction 108. A corresponding ratio between a depleted region below the gate insulation layer 109 and a quasi-neutral region, which is the main factor determining the diode behavior of the PN-junction 108, usually depends on the thickness of the layer 103. Consequently, an ongoing reduction of the thickness of the layer 103 as required for scaling SOI devices may increasingly adversely influence the diode characteristics of the structure 100. In extreme cases, the active region 105 may be depleted entirely, resulting in a substantially complete elimination of the diode function of the structure 100. Hence, a further scaling of SOI devices may suffer from a reduced ideality of integrated diode structures.

In view of the problems identified above, a need exists for an improved technique for forming diode structures on an SOI substrate, which provides enhanced diode characteristics for scaled SOI devices.

SUMMARY OF THE INVENTION

Generally, the present invention is directed to a technique for forming diode structures in an SOI device, in which an MOS structure is avoided in that a conductive line is replaced by a dielectric region acting as an implantation mask and a silicide blocking region.

According to one illustrative embodiment of the present invention, a semiconductor device comprises an insulating substrate and a semiconductor layer formed on the insulating substrate. A P-doped region and an N-doped region are formed in the semiconductor layer. A PN-junction is formed between the P-doped region and the N-doped region and an insulating region is formed on the semiconductor layer, which covers the PN-junction. The insulating region has a thickness that is configured to substantially avoid a capacitive coupling to the PN-junction.

According to another illustrative embodiment of the present invention a diode structure in an SOI device comprises a P-doped region and an N-doped region arranged to form a PN-junction. A first silicide region is formed in the P-doped region and a second silicide region is formed in the N-doped region. A first contact plug is provided that connects to the first silicide region and a second contact plug is provided that connects to the second silicide region. Finally, an insulating material is formed between the first and second contact plugs so as to substantially fill a space therebetween.

According to yet another illustrative embodiment of the present invention, a method comprises forming a dielectric mask region above a semiconductor layer formed on an insulating substrate. A P-doped region and an N-doped region are formed in the semiconductor layer using the dielectric mask region to create a PN-junction between the P-doped region and the N-doped region below the dielectric mask region.

BRIEF DESCRIPTION OF THE DRAWINGS

The invention may be understood by reference to the following description taken in conjunction with the accompanying drawings, in which like reference numerals identify like elements, and in which.

Figure 1:
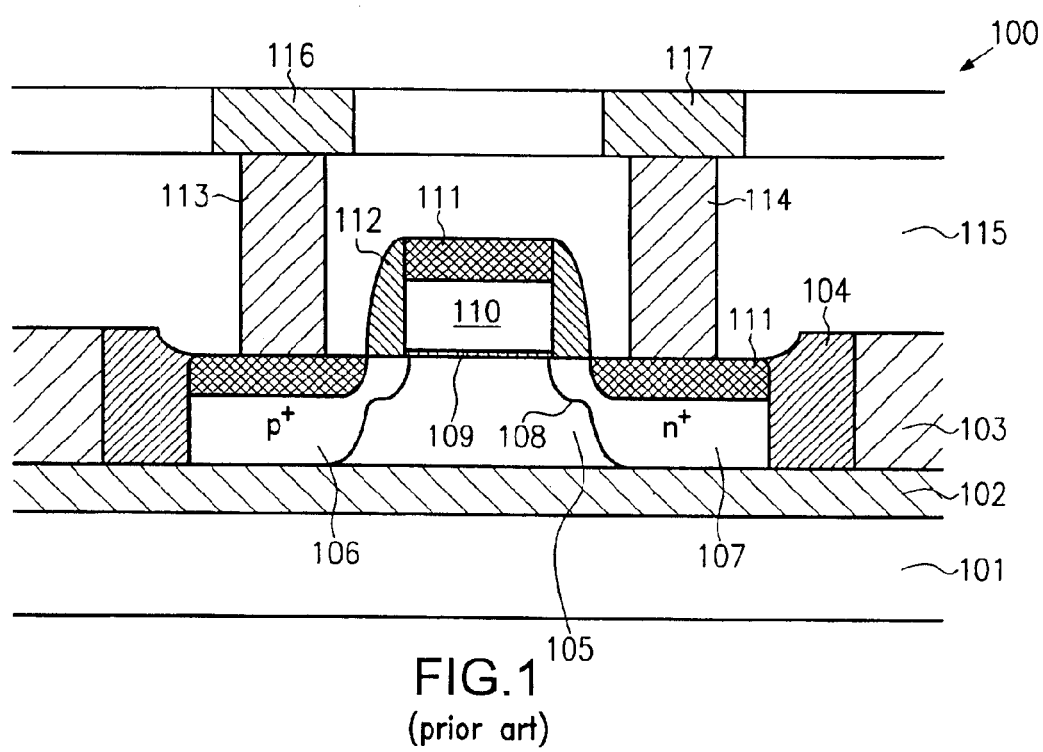
FIG. 1 schematically shows a conventional diode structure for an SOI device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2A:
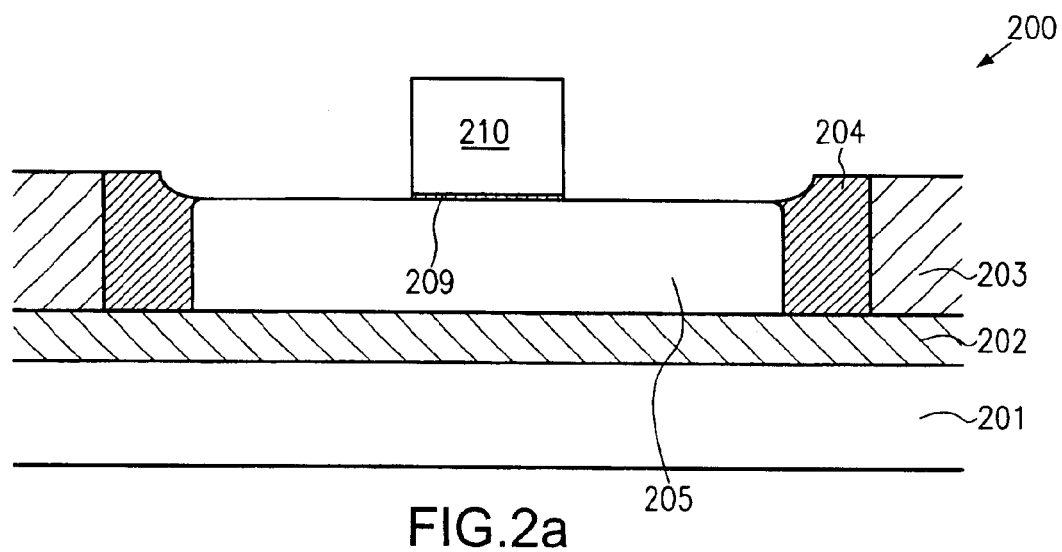
FIGS. 2a–2f schematically depict cross-sectional views and top views, respectively, of a diode structure during various manufacturing stages according to illustrative embodiments of the present invention.

With reference to FIGS. 2a–2e, further illustrative embodiments of the present invention will now be described in more detail. In FIG. 2a, a semiconductor structure 200 comprises a substrate 201, which may be a dielectric substrate, a semiconductor substrate, or any other substrate that is considered appropriate for forming thereon semiconductor devices. An insulating layer 202 is formed on the substrate 201, wherein the insulating layer 202 may be comprised of any suitable dielectric material. In one particular embodiment, the substrate 201 is a silicon substrate and the insulating layer 202 is substantially comprised of silicon dioxide. A semiconductor layer 203 is formed on the insulating layer 202 and may comprise any semiconductive material of high crystalline quality and, in a particular embodiment, the layer 203 is comprised of crystalline silicon. Trench isolations 204 comprising any appropriate insulating material such as silicon dioxide and/or silicon nitride for silicon-based semi-conductor devices may be formed in the semiconductor layer 203 and define therein an active region 205. In this respect, an active region is to be considered as a semiconductive region intended to conduct a current and whose conductivity is adjusted by providing dopants therein.

Formed above the active region 205 is a dielectric mask region 210 having a shape and dimensions that allows appropriate shielding of a portion of the active region 205 in subsequent implantation processes, as will be described later on. The dielectric mask region 210 may be formed of an appropriate insulating material, such as silicon dioxide, silicon nitride, or any other material that is appropriate for the semiconductor structure 200 and is compatible with the manufacturing process thereof. In one illustrative embodiment, a dielectric layer 209 may be provided between the dielectric mask region 210 and the active region 205. The insulating layer 209 may have a thickness that substantially conforms to a thickness of a gate insulation layer of transistor devices that may be formed in other areas of the substrate 201.

A typical process flow for forming the semiconductor structure 200 as shown in FIG. 2a may comprise the following processes. First, the substrate 201 including the insulating layer 202 and the semiconductor layer 203 may be formed by sophisticated wafer bonding techniques or may be provided as an SOI substrate, as is available from a plurality of semiconductor suppliers. Thereafter, the trench isolations 204 are formed by lithographically patterning a resist and anisotropically etching respective trenches into the semiconductor layer 203. Thereafter, the trenches are filled with one or more suitable dielectric materials and the excess dielectric material may then be removed by chemical mechanical polishing (CMP). Next, the insulating layer 209, if provided, may be formed by advanced deposition methods and/or oxidation processes, if the insulating layer 209 is substantially comprised of an oxide. Thereafter, an insulating material layer may be deposited and subsequently patterned by advanced lithography techniques so as to form the dielectric mask region 210. In one illustrative embodiment, the dielectric mask region 210 may be directly formed on the active region 205. The shape of the dielectric mask region 210 may be selected in accordance with design requirements, wherein the purpose of the semiconductor structure 200, which will act as a diode structure, may affect the finally selected layout of the dielectric mask region 210 and of the semiconductor structure 200. For example, in the illustrative embodiment shown in FIG. 2a, the dielectric mask region 210 represents a substantially straight line, whereas, in other embodiments, the dielectric mask region 210 may have any other appropriate shape, such as a closed loop including a plurality of continuous straight-line elements.

A height and a lateral dimension of the dielectric mask region 210 is selected so as to provide a required blocking capacity to obtain a dopant profile below the dielectric mask region 210 in the active region 205 during subsequent implantation steps as will be described later. For example, a lateral dimension of the dielectric mask region 210 may range from approximately 0.03–0.2 $\mu$m, whereas a height thereof may range from approximately 30–100 nm.

Figure 2B:
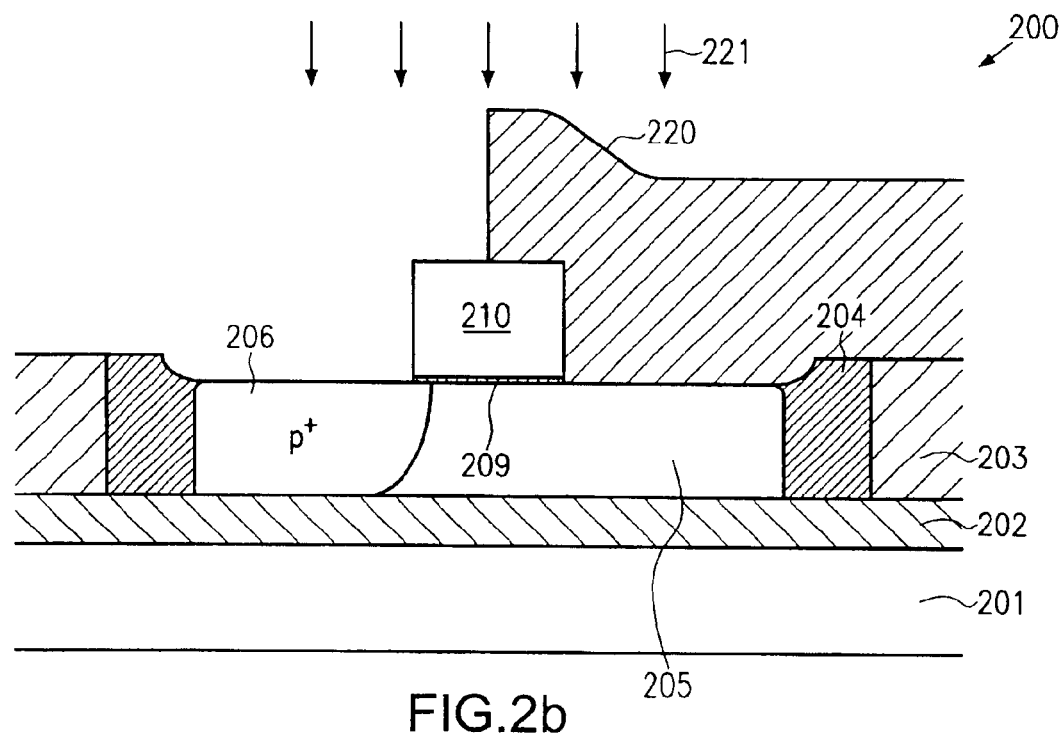

FIG. 2b schematically shows the semiconductor structure 200 in a further advanced manufacturing stage. A resist mask 220 is formed over a portion of the semiconductor structure 200 so as to shield a portion of the active region 205, intended to receive an N-type dopant, and to expose a portion of the active region 205 to an ion bombardment 221 to form a P-type doped region 206.

The resist mask 220 is formed by standard photolithography techniques, wherein the alignment of a corresponding photolithography mask with respect to the substrate 201 is not critical as long as the resist mask 220 does not cover a portion of the active region 205, in which the P-type region 206 is formed. Thus, the lateral dimension of the dielectric mask region 210 provides for a sufficient margin in aligning the photolithographic mask and the substrate 201. After the formation of the resist mask 220, an ion implantation is performed, represented by the ion bombardment 221, to form the P-type region 206 exhibiting a required high dopant concentration within the active region 205. For convenience, it is assumed that the active region 205 is per se slightly P-doped, whereas, in other embodiments, the active region 205 may be N-doped. During the ion bombardment 221, carried out at an appropriate implantation energy and dose tailored for the thickness of the layer 203 and the dopant to be implanted, such as boron, indium, and the like, and possibly including any tilted implantation steps if required, the dielectric mask region 210 substantially determines the dopant profile, i.e., the dopant gradient at the transition between the active region 205 and the region 206. That is, the dopant profile may be controlled by adjusting the lateral dimension, i.e., a width, of the dielectric mask region 210 with respect to the specifics of the implantation, such as tilt angle, and of a subsequent anneal cycle. For instance, if a small width of the dielectric mask region 210 is selected for given implant and subsequent anneal specifics, the dopant concentration may decrease but may reach a considerable distance beyond the edge of the dielectric mask region. In combination with a subsequent implant process, as will be described below, this distance may then determine the final dopant concentration at a PN-junction to be formed.

Figure 2C:
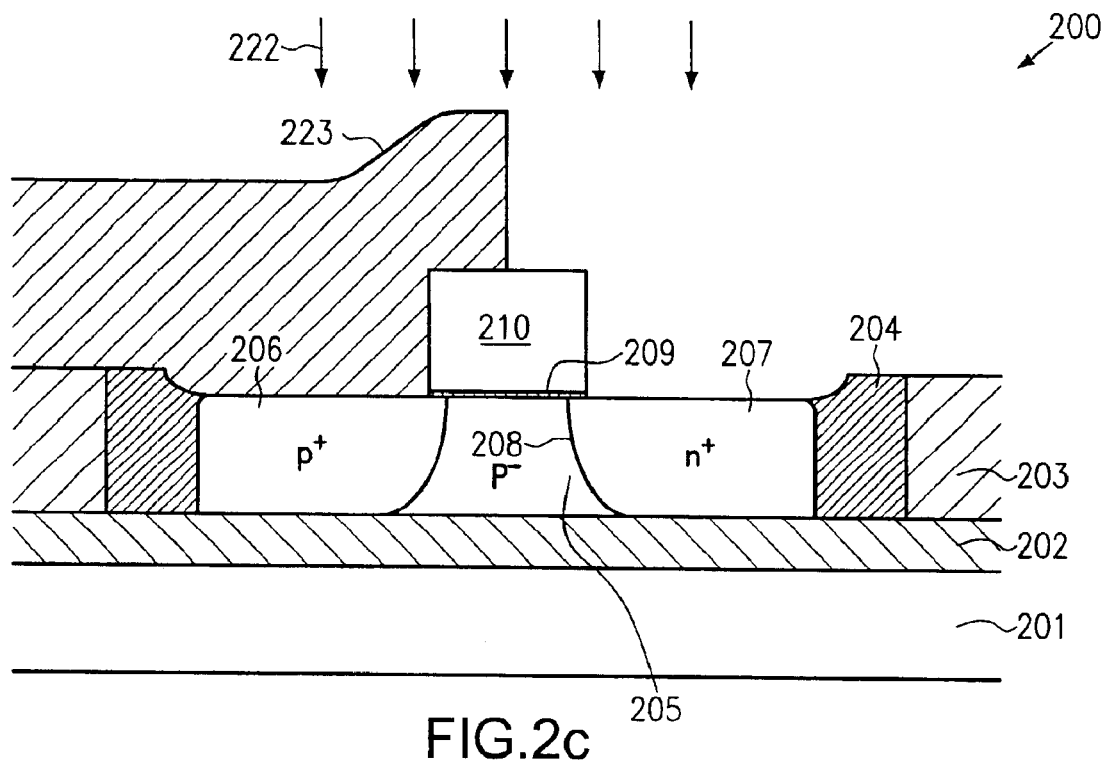

FIG. 2c schematically shows the semiconductor structure 200 in a similar arrangement as in FIG. 2b, with the exception that a second resist mask 223 is formed above the structure 200 so as to expose a portion of the active region 205 to a second ion bombardment 222, thereby creating an N-type region 207. The N-type region 207 together with the active region 205, which is slightly P-doped, form a PN-junction 208, the location of which is substantially determined by the process parameters of the ion bombardment 222 and the dimension and position of the dielectric mask region 210. The process parameters, such as implantation energy, dose, type of dopant material, tilt angle, and the like, may be selected as dictated by the design requirements for the structure 200. It should be noted that the precise characteristics of the PN-junction 208 depend on further process specifics, such as any anneal cycles for activating the dopants and curing any lattice damage created by the ion bombardment 221, 222. Since typically the process parameters such as temperature and duration of any anneal cycles for activating the dopants in the regions 206 and 207 may depend on corresponding anneal cycles carried out for further transistor structures that may also be formed on the substrate 201, the dimensions of the dielectric mask region 210 in combination with the process parameters of the ion bombardment 221, 222 are selected such that the dopant profile of the PN-junction 208 as implanted may then, after the anneal cycle, exhibit a dopant gradient as necessary for obtaining a substantially ideal diode characteristic. That is, the dimensions of the dielectric mask region 210 are selected so as to obtain a desired decrease in the dopant concentration towards the PN-junction 208 that results in a diode characteristic rather than in a Zener characteristic, which would be obtained with the high dopant concentrations prevailing at the uncovered portion of the region 207. It should be emphasized that, contrary to the conventional diode structure shown in FIG. 1, the semiconductor structure 200 is devoid of a MOS structure, wherein the dielectric mask region 210 precisely defines the dopant concentration and the location of the PN-junction 208. Due to the provision of the dielectric mask region 210, the PN-junction 208 is therefore "self-aligned" in the sense that its position is defined by the position of the mask region 210.

Figure 2D:
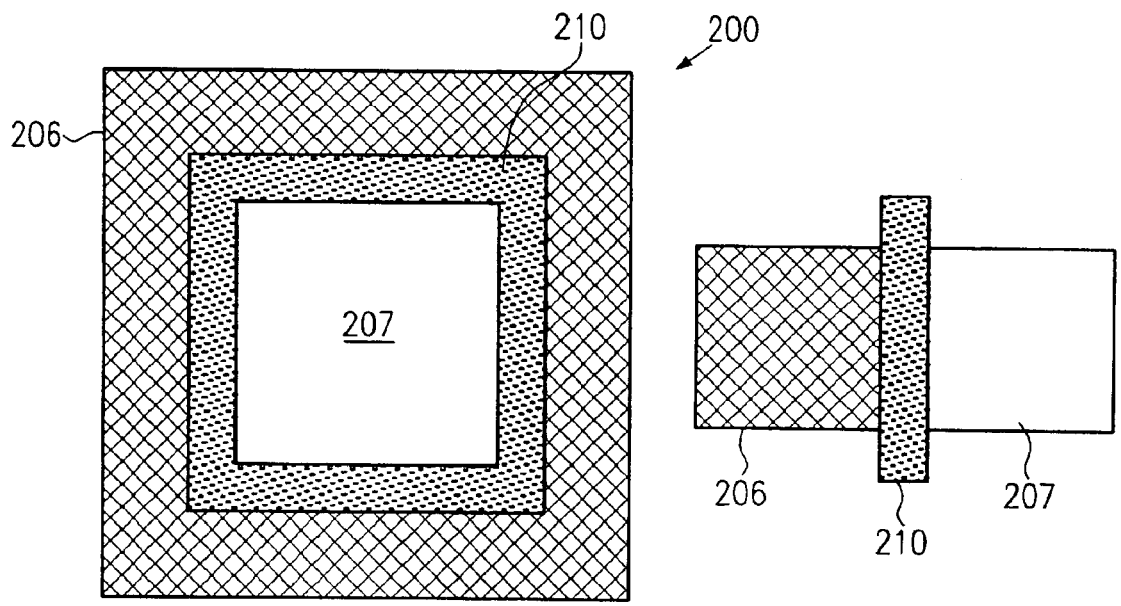

FIG. 2d schematically shows, on the right-hand side, a top view of the semiconductor structure 200 according to one illustrative embodiment of the present invention. The general shape of the semiconductor structure 200 is similar to the design of a typical transistor structure of a MOS transistor used in SOI devices. That is, the P-doped region 206 and the N-doped region 207 are arranged side by side in a "linear" configuration.

The left-hand side of FIG. 2d schematically shows a top view of a further illustrative embodiment, wherein the dielectric mask region 210 encloses the substantially square-shaped region 207, whereby the P-type region 206 surrounds the N-active square 207 with the PN-junction 208 (not shown) located therebetween. The designs shown in FIG. 2d are of illustrative nature only and other diode structure designs may be used in a way that is deemed appropriate for a certain purpose. For instance, the type of dopants of the embodiment shown on the left hand side may be exchanged and the square shape may be replaced by any other appropriate shape, for example a rectangular shape, as desired. Particularly the embodiment shown on the left-hand side of FIG. 2d provides a significantly increased area of the PN-junction 208 compared to a linear "transistor-like" configuration and thus allows relatively high currents to flow through the PN-junction 208, which would lead to an excessive heat development in a linear arrangement as shown on the right-hand side in FIG. 2d or as is the case in the conventional diode structure shown in FIG. 1. Therefore, in addition to the elimination of a MOS structure due to the provision of a dielectric material instead of a polysilicon line, a high degree of design flexibility is obtained with the present invention.

Figure 2E:
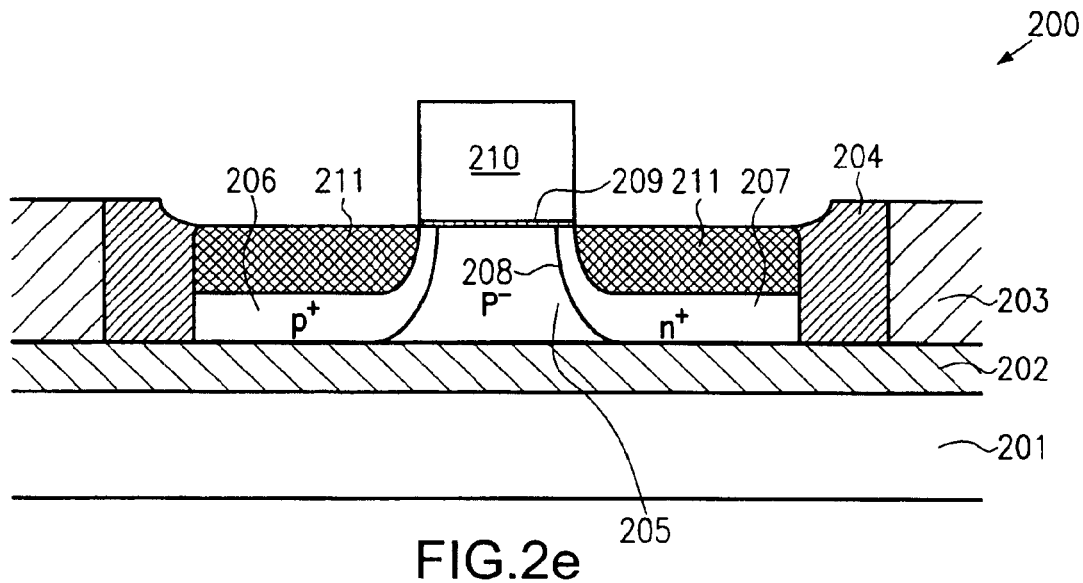

FIG. 2e schematically shows the semiconductor structure 200 with silicide regions 211 formed in the P-type region 206 and the N-type region 207. The silicide regions 211 may comprise any appropriate silicide of a refractory metal, such as titanium, tantalum, tungsten, cobalt, nickel and the like.

A typical process flow for forming the semiconductor structure 200 as shown in FIG. 2e may, starting from the configuration shown in FIG. 2c, comprise the following steps. After removing the resist mask 223 (FIG. 2c), an anneal cycle may be carried out so as to activate the dopants in the regions 206 and 207 and cure implantation-induced crystal-line damage in the regions 206 and 207. In this context, it should be noted that usually a plurality of other circuit elements, such as MOS transistors, are fabricated during the process sequence for forming the semiconductor structure 200. Therefore, prior to or after the formation of the dielectric mask region 210, one or more process steps may have been performed so as to form, for example, gate electrodes for transistor devices on other areas of the substrate 201. In a particular embodiment, the dielectric mask region 210 is created after the formation of gate electrodes on other areas of the substrate 201. Moreover, the ion bombardment 221 and 222 may be carried out in combination with corresponding implantation processes required for the formation of P-channel transistors and N-channel transistors. In one illustrative embodiment, a resist mask (not shown) may be provided that substantially covers the semiconductor structure 200 during a halo implantation as required for sophisticated transistor elements for SOI devices, thereby avoiding any deleterious effects of the halo implant on the PN-junction 208. In other embodiments, the creation of an appropriate dopant profile in a transistor element may require the formation of sidewall spacers at respective gate electrodes, such as the sidewall spacers 112 in FIG. 1. Therefore, it may be considered appropriate to also form dielectric sidewall spacers on sidewalls of the dielectric mask region 210 along with the corresponding spacers of transistor elements. In this case, the initial lateral width of the dielectric mask region 210 is selected in such a way that the finally-obtained lateral dimension including any dielectric sidewall spacers results in the desired overall width of the combination of the sidewall spacers and the dielectric mask region 210.

Irrespective of the additional process steps described above, a refractory metal is then deposited over the structure 200 according to design requirements, which may be selected to conform with any transistor elements that are additionally to be formed on the substrate 201. By carrying out an appropriate anneal cycle, a silicidation sequence is initiated, wherein, according to the dielectric nature of the material of the mask region 210, substantially no metal silicide is formed in and on the dielectric mask region 210. Depending on the type of metal silicide formed in the regions 211, one or more deposition and/or anneal cycles may be necessary, wherein excess metal may be removed prior to or after one or more anneal cycles. Similarly to the conventional process flow described with reference to FIG. 1 and similarly to the formation of transistor structures, the silicidation process for forming the regions 211 is self-aligned and avoids an electrical short of the PN-junction 208 due to the dielectric nature of the mask region 210 and the absence of silicide thereon.

Figure 2F:
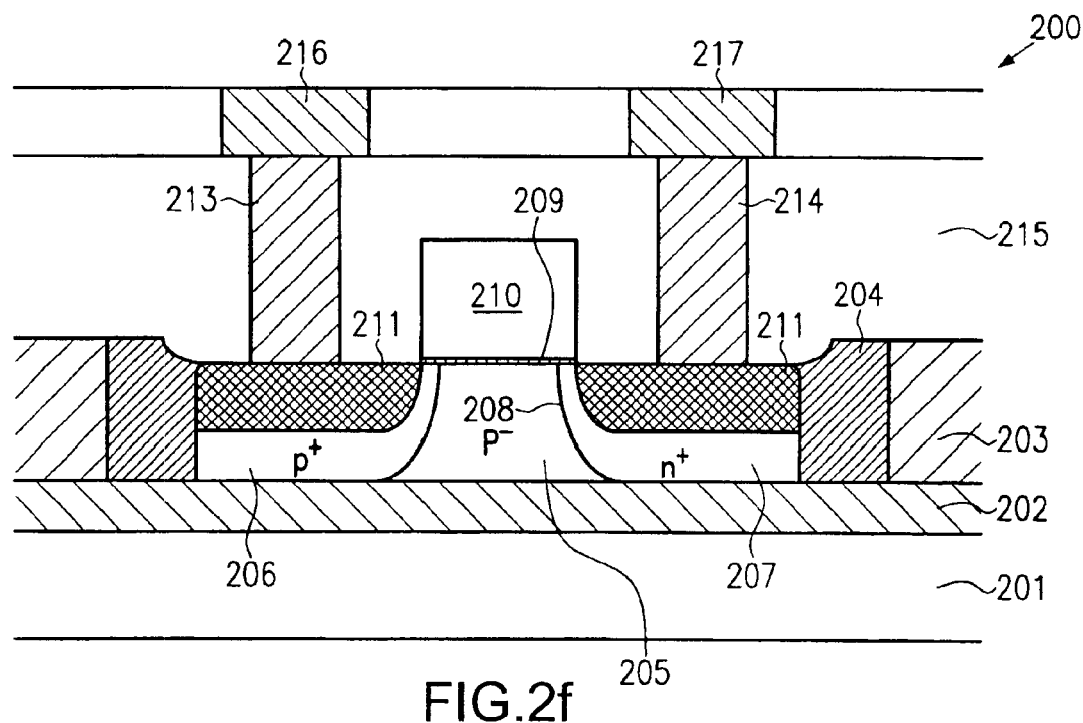

FIG. 2f schematically shows the semiconductor structure 200 in a substantially completed state. The semiconductor structure 200 comprises an insulating layer 215, for example comprised of silicon dioxide, silicon nitride, or any other suitable dielectric material, wherein a contact plug 213, connecting to the P-type region 206 via the respective region 211, and a contact plug 214, connecting to the N-type region 207 via the respective region 211, are provided. As already pointed out with reference to FIG. 1, any appropriate metal, possibly in combination with a suitable barrier material, may be used in forming the contact plugs 213, 214. It is noted that, contrary to the conventional design described with reference to FIG. 1, an electrical connection between the gate electrode 110 and the corresponding contact plug 114 is obsolete according to the present invention. The contact plugs 213, 214 may be connected to any appropriate metal lines, represented by regions 216, 217, which finally provide for the required connection to other circuit elements or input and output terminals. The formation of the contact plugs 213, 214 in the insulating layer 215 may be accomplished by well-established deposition, lithography, and etch techniques.

It should be emphasized that, contrary to the conventional diode structures shown in FIG. 1, a capacitive coupling to the active region 205 including the PN-junction 208 by any adjacent metal or conductive regions is at least significantly reduced or even substantially completely avoided, since a space above the active region 205 and the PN-junction 208 is substantially completely filled with dielectric material from the dielectric mask region 210, the insulating layer 209, if provided, and the insulating layer 215. That is, the structure 200 does not include a MOS structure as is the case in the conventional structure 100. It should further be appreciated that, depending on the type of material used in the insulating layer 215 and the mask region 210, an interface therebetween may not necessarily be formed when substantially the same materials as well as the same deposition methods have been used in forming the insulating layer 215 and the mask region 210. Moreover, as previously noted, the mask region 210 may additionally comprise sidewall spacers (not shown), comprised of the same or a different material as compared to the dielectric mask region 210 and the insulating layer 215 when a corresponding process sequence is selected, as is previously explained.

In other embodiments, it may be necessary to increase the height of the regions 206, 207 by, for example, selectively epitaxially growing silicon or any other appropriate semiconductive material prior to performing the ion bombardments 221, 222 for forming the regions 206, 207. Respectively increased regions 206, 207 may be required when a thickness of the semiconductor layer 203 has to be made extremely thin so as to comply with design requirements for highly sophisticated SOI semiconductor devices. Typically, scaling down the overall dimensions of transistor structures in SOI schemes may necessitate the employment of very thin semiconductor layers to maintain the required transistor performance even for a very short channel length. However, the dopant concentration of corresponding drain and source regions as well as a vertical extension of corresponding silicide regions may not suffice to provide for the required small sheet resistance of these areas. Therefore, the size of the drain and source regions may be increased in the vertical direction, thereby lowering the overall sheet resistance. The present invention, i.e., the diode structure as represented by the semiconductor structure 200, may also be applied to a process sequence requiring the selective epitaxial growth of the active region 205 adjacent to the dielectric mask region 210 without adding additional process complexity.

As a consequence, providing the dielectric mask region 210 instead of a polysilicon gate that has to be connected to one of the highly doped regions allows a high degree of design flexibility, even for extremely thin semiconductor layers 203 required in high-end SOI devices.

During the operation of the semiconductor structure 200, the diode characteristic is substantially determined by the PN-junction 208, even for an extremely thin active region 205, since, due to the absence of a depletion region created by the capacitive coupling of a conductor to the underlying active region 205, any variations of the effective area of the PN-junction 208 are substantially avoided. Thus, the efficiency in temperature monitoring is maintained, even if the semiconductor structure 200 is scaled down to accommodate transistors having gate length dimensions in the range of 0.04 $\mu$m and even less. Moreover, the design flexibility accomplished by the present invention allows the formation of PN-junctions having an increased area, which results in a significantly enhanced current drive capability compared to the conventional design shown in FIG. 1, thereby providing extremely effective ESD protection diode structures for SOI devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a dielectric mask region above a P-doped semiconductor layer formed on an insulating substrate; and
   forming a P-doped region and an N-doped region in said P-doped semiconductor layer, said P-doped region and said N-doped region being self-aligned with respect to said dielectric mask region, wherein a PN-junction is created between the P-doped semiconductor layer and the N-doped region below said dielectric mask region.

2. The method of claim 1, further comprising forming silicide regions in said P-doped and N-doped regions, wherein said dielectric mask region prevents a short between the P-doped region and the N-doped region.

3. The method of claim 1, further comprising forming an insulating layer on said semiconductor layer, wherein said dielectric mask region is formed on said insulating layer.

4. The method of claim 1, further comprising adjusting a width of said dielectric mask region so as to control a dopant gradient towards said PN-junction.

5. The method of claim 4, wherein said width is in the range of approximately 0.03–0.2 µm.

6. The method of claim 1, wherein forming said P-doped region and said N-doped region includes forming a resist mask to cover a first portion and expose a second portion of said semiconductor layer and to partially cover said dielectric mask region.

7. The method of claim 6, further comprising implanting N-type dopants into said second portion to form the N-doped region.

8. The method of claim 7, further including forming a second resist mask to cover said second portion and expose said first portion of said semiconductor layer and to partially cover said dielectric mask region.

9. The method of claim 8, further comprising implanting P-type dopants into said first portion to form the P-doped region.

10. The method of claim 1, further comprising forming a first contact plug, connecting to said P-doped region, and forming a second contact plug, connecting to said N-doped region.

11. The method of claim 1, wherein said P-doped region and said N-doped region are arranged in a side-by-side configuration.

12. The method of claim 1, wherein one of said P-doped region and said N-doped region is arranged to at least partially enclose the other one of said P-doped region and said N-doped region.

13. The method of claim 1, further comprising forming a transistor structure in said semiconductor layer.

14. The method of claim 13, further comprising forming a halo implantation mask that at least covers a first portion and a second portion of said semiconductor layer prior to forming said P-doped region and said N-doped region in said first and second portions, respectively.

15. A method, comprising:
    forming a dielectric mask region above a P-doped semiconductor layer on an insulating substrate; and
    forming a P-doped region and an N-doped region in said P-doped semiconductor layer wherein a PN-junction is created between said N-doped region and said P-doped semiconductor layer, wherein forming said N-doped region comprises:
    forming a first resist mask above said P-doped semiconductor layer and at least a portion of said dielectric mask region to thereby define a first exposed portion of said P-doped semiconductor layer; and
    performing at least one ion implant process to implant an N-type dopant material into said first exposed portion of said P-doped semiconductor layer.

16. The method of claim 15, wherein said P-doped region and said N-doped region are self-aligned with respect to said dielectric mask region.

17. The method of claim 15, wherein forming said P-doped region comprises:
    forming a second resist mask above said P-doped semiconductor layer and at least a portion of said dielectric mask region to thereby define a second exposed portion of said semiconductor layer; and
    performing at least one ion implant process to implant a P-type dopant material into said second exposed portion of said P-doped semiconductor layer.

18. The method of claim 15, further comprising forming silicide regions in said P-doped and N-doped regions, wherein said dielectric mask region prevents a short between the P-doped region and the N-doped region.

19. The method of claim 15, further comprising forming an insulating layer on said semiconductor layer, wherein said dielectric mask region is formed on said insulating layer.

20. The method of claim 15, further comprising adjusting a width of said dielectric mask region so as to control a dopant gradient towards said PN-junction.

21. The method of claim 20, wherein said width is in the range of approximately 0.03–0.2 µm.

22. The method of claim 15, further comprising forming a first contact plug, connecting to said P-doped region, and forming a second contact plug, connecting to said N-doped region.

23. The method of claim 15, further comprising forming a transistor structure in said semiconductor layer.

24. A method, comprising:
    forming a dielectric mask region above an N-doped semiconductor layer formed on an insulating substrate; and
    forming a P-doped region and an N-doped region in said N-doped semiconductor layer, said P-doped region and said N-doped region being self-aligned with respect to said dielectric mask region, wherein a PN-junction is created between the N-doped semiconductor layer and the P-doped region below said dielectric mask region.

25. The method of claim 24, further comprising forming silicide regions in said P-doped and N-doped regions, wherein said dielectric mask region prevents a short between the P-doped region and the N-doped region.

26. The method of claim 24, further comprising forming an insulating layer on said semiconductor layer, wherein said dielectric mask region is formed on said insulating layer.

27. The method of claim 24, further comprising adjusting a width of said dielectric mask region so as to control a dopant gradient towards said PN-junction.

28. The method of claim 27, wherein said width is in the range of approximately 0.03–0.2 µm.

29. The method of claim 24, wherein forming said P-doped region and said N-doped region includes forming a resist mask to cover a first portion and expose a second portion of said semiconductor layer and to partially cover said dielectric mask region.

30. The method of claim 29, further comprising implanting N-type dopants into said second portion to form the N-doped region.

31. The method of claim 30, further including forming a second resist mask to cover said second portion and expose said first portion of said semiconductor layer and to partially cover said dielectric mask region.

32. The method of claim 31, further comprising implanting P-type dopants into said first portion to form the P-doped region.

33. The method of claim 24, further comprising forming a first contact plug, connecting to said P-doped region, and forming a second contact plug, connecting to said N-doped region.

34. The method of claim 24, wherein said P-doped region and said N-doped region are arranged in a side-by-side configuration.

35. The method of claim 24, wherein one of said P-doped region and said N-doped region is arranged to at least partially enclose the other one of said P-doped region and said N-doped region.

36. The method of claim 24, further comprising forming a transistor structure in said semiconductor layer.

37. The method of claim 36, further comprising forming a halo implantation mask that at least covers a first portion and a second portion of said semiconductor layer prior to forming said P-doped region and said N-doped region in said first and second portions, respectively.

38. A method, comprising:
    forming a dielectric mask region above an N-doped semiconductor layer on an insulating substrate; and
    forming a P-doped region and an N-doped region in said N-doped semiconductor layer wherein a PN junction is created between said P-doped region and said N-doped semiconductor layer, wherein forming said P-doped region comprises:
        forming a first resist mask above said N-doped semiconductor layer and at least a portion of said dielectric mask region to thereby define a first exposed portion of said N-doped semiconductor layer; and
        performing at least one ion implant process to implant a P-type dopant material into said first exposed portion of said N-doped semiconductor layer.

39. The method of claim 38, wherein said P-doped region and said N-doped region are self-aligned with respect to said dielectric mask region.

40. The method of claim 38, wherein forming said N-doped region comprises:
    forming a second resist mask above said N-doped semiconductor layer and at least a portion of said dielectric mask region to thereby define a second exposed portion of said N-doped semiconductor layer; and
    performing at least one ion implant process to implant an N-type dopant material into said second exposed portion of said N-doped semiconductor layer.

41. The method of claim 38, further comprising forming silicide regions in said P-doped and N-doped regions, wherein said dielectric mask region prevents a short between the P-doped region and the N-doped region.

42. The method of claim 38, further comprising forming an insulating layer on said semiconductor layer, wherein said dielectric mask region is formed on said insulating layer.

43. The method of claim 38, further comprising adjusting a width of said dielectric mask region so as to control a dopant gradient towards said PN-junction.

44. The method of claim 43, wherein said width is in the range of approximately 0.03–0.2 $\mu$m.

45. The method of claim 38, further comprising forming a first contact plug, connecting to said P-doped region, and forming a second contact plug, connecting to said N-doped region.

46. The method of claim 38, further comprising forming a transistor structure in said semiconductor layer.

* * * * *